(12) United States Patent
Wu et al.

(10) Patent No.: US 9,347,971 B2
(45) Date of Patent: May 24, 2016

(54) PROBING DEVICE

(75) Inventors: Chien-Chou Wu, Chu-Pei (TW);
Ming-Chi Chen, Chu-Pei (TW);
Chung-Che Li, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 968 days.

(21) Appl. No.: 13/562,276

(22) Filed: Jul. 30, 2012

(65) Prior Publication Data
US 2013/0033283 A1    Feb. 7, 2013

(30) Foreign Application Priority Data

Aug. 3, 2011 (TW) .............................. 100127587 A
Jul. 17, 2012 (TW) .............................. 101213755 U

(51) Int. Cl.
*G01R 31/00* (2006.01)
*G01R 1/073* (2006.01)

(52) U.S. Cl.
CPC ........ *G01R 1/07342* (2013.01); *G01R 1/07378* (2013.01)

(58) Field of Classification Search
CPC ..................... G01R 1/07378; G01R 1/07342
USPC ............................................ 324/756.03
See application file for complete search history.

(56) References Cited

U.S. PATENT DOCUMENTS

| | | | |
|---|---|---|---|
| 5,534,784 A * | 7/1996 | Lum | ................ G01R 1/07378 324/754.03 |
| 5,932,891 A | 8/1999 | Higashi et al. | |
| 2008/0180123 A1 | 7/2008 | Cheng et al. | |

FOREIGN PATENT DOCUMENTS

| | | |
|---|---|---|
| CN | 200968961 Y | 10/2007 |
| EP | 2026078 A1 | 2/2009 |
| TW | 200409582 A | 6/2004 |
| TW | 200846671 A | 12/2008 |

* cited by examiner

Primary Examiner — Thomas F Valone
(74) Attorney, Agent, or Firm — Ding Yu Tan

(57) ABSTRACT

A probing device includes a circuit board, a reinforcing plate, at least one space transformer and at least one probe assembly. The reinforcing plate is disposed on the circuit board, and the reinforcing plate has a plurality of inner conductive wires electrically connecting to those of the circuit board. The reinforcing plate defines a plurality of receiving space therein. The space transformer is disposed on the reinforcing plate, and the space transformer has a plurality of inner conductive wires electrically connecting to those of the reinforcing plate via a plurality of first solder balls. The probe assembly is disposed on the space transformer, and the probe assembly includes a plurality of probes. The first solder balls are disposed in the receiving spaces, and the reinforcing plate abuts against the space transformer.

25 Claims, 15 Drawing Sheets

:
PROBING DEVICE

FIELD OF THE INVENTION

The present invention relates to a testing device, and more particularly to a probing device for wafer-level testing.

BACKGROUND

It typically involves many steps, including lithography, deposition, etching and etc., to form a plurality of integrated circuit (IC) chips on a wafer. Due to the complication of the manufacturing process, some chips are inevitably defective. Therefore, the chips are tested for functional defects before the wafer is sent to dicing preparation.

Please refer to FIG. 1A, which shows a conventional probing device 10. The conventional probing device 10 includes a circuit board 12, a space transformer 14, and a probe assembly 16. The space transformer 14 is disposed on the circuit board 12 with an interface composed of a plurality of solder balls 142. The probe assembly 16 is disposed on the space transformer 14 and has a plurality of probes 162, by which the chips on the wafer are tested. Conductive wires (not shown) within the space transformer 14 are used to electrically connect the probes 162 of the probe assembly 16 to the conductive wires on the circuit board 12. In such a configuration manner, testing signals received by the probes 162 can be transmitted to the circuit board 12 via the space transformer 14.

Please refer to FIGS. 1A and 1B simultaneously, in which FIG. 1B shows a force distribution of the space transformer 14 as shown in FIG. 1A. For a better presentation of the distribution of a force F1, the probes 162 are not shown in FIG. 1B. A plurality of pads 141 are distributed over the space transformer 14. When the probing device 10 is running or operating, the probes 162 of the probe assembly 16 contact a device under test (DUT) while a counter force is applied onto the probes 162 by the DUT in such a manner that the probes 162 applies a force F1 to the space transformer 14.

Although the solder balls 142 disposing between the space transformer 14 and the circuit board 12 can support and prevent the space transformer 14 from deformation, some portions of space transformer 14 located on a plurality of gaps 143 between the solder balls 142 receive little structural support and thus plastically deform toward the circuit board 12 resulted from the force F1. The smaller the size of IC chip is, the denser of the distribution of the probes 162 becomes, and thus the bigger the force applies on a unit area of the space transformer 14. The space transformer 14 is, therefore, much more easily deformed by the force F1, and thus flatness of the space transformer 14 as well as that of the probe card is affected. The worse the flatness of the probe card is, the bigger the over drive needs to be. That is, the force has to be large or sufficient enough to enable the probes 162 to practically contact the corresponding pads on the space transformer 14. However, such a bigger amount of force results in more serious deformation of the space transformer 14 and more wear to the probes 162 themselves, thereby shortening the service life of the space transformer 14 and the probes 162.

Moreover, even though the probing devices 10 in the market are manufactured by specialized manufacturers, most of the space transformers 14 are still provided by IC manufacturers or IC designers for cost concerns. There is a trend that those space transformers 14 provided are thereby becoming thinner and thinner. However, a thinner space transformer 14 may deform even more seriously once pressed by the force F1.

Please refer to FIG. 1C for another conventional probing device 10', in which a protecting gel 144 is filled between the circuit board 12 and the space transformer 14 to prevent the solder balls 142 from being polluted. Although the protecting gel 144 can be used to support the space transformer 14, there might still be gaps found between the space transformer 14 and the protecting gel 144 because of the lower hardness/rigidity and uniformity of the protecting gel 144. If the space transformer 14 cannot effectively contact the protecting gel 144, the supporting ability of the protecting gel 144 cannot be brought into full play, either.

Therefore, it is of concern to those skilled in the art as how to avoid the space transformer 14 from deformation caused by the force F1.

SUMMARY OF THE INVENTION

The main objective of the present invention is to provide a probing device which can avoid a space transformer from deformation while pressed.

To achieve the above and other objectives, the present invention provides a probing device including a circuit board, a reinforcing plate, at least one space transformer, and at least one probe assembly. The reinforcing plate is disposed on the circuit board, and the reinforcing plate has a plurality of inner conductive wires electrically connecting to those of the circuit board. The space transformer is disposed on the reinforcing plate, and the space transformer has a plurality of inner conductive wires electrically connecting to those of the reinforcing plate via a plurality of first solder balls. The probe assembly is disposed on the space transformer, and the probe assembly includes a plurality of probes. Wherein, a plurality of receiving space is defined between the reinforcing plate and the space transformer for receiving the first solder balls. The reinforcing plate abuts against the space transformer.

In the probing device, the reinforcing plate is a reinforcing plate having a plurality of protrusions abutting against the space transformer. Furthermore, the reinforcing plate is made of machinable ceramic, and the protrusion is made of photoresist.

In the probing device, the reinforcing plate is a reinforcing plate having a plurality of first protrusions, and the space transformer has a plurality of second protrusions abutting against the first protrusions. Furthermore, the first and second protrusions are made of photoresist.

In the probing device, the reinforcing plate is a reinforcing plate, the space transformer has a plurality of protrusions abutting against the reinforcing plate, and the protrusions define the receiving space.

In the probing device, the reinforcing plate has a plurality of inner conductive wires electrically connecting to those of the circuit board via a plurality of second solder balls located right or directly beneath the first solder balls.

In the probing device, the reinforcing plate is a multi-layered ceramic structure, and the space transformer is a multi-layered organic structure.

To achieve the above and other objectives, the present invention provides another probing device including a circuit board, a first reinforcing plate, at least one space transformer, and at least one probe assembly. The first reinforcing plate is disposed on the circuit board, the first reinforcing plate has a plurality of receiving spaces, and the receiving spaces are passed through the first reinforcing plate. The space transformer is disposed on the first reinforcing plate, and the space transformer has a plurality of inner conductive wires electrically connecting to those of the circuit board via a plurality of solder balls. The probe assembly is disposed on the space transformer, and the probe assembly has a plurality of probes. The first solder balls are disposed in the receiving spaces, and the first reinforcing plate abuts against the space transformer.

To achieve the above and other objectives, the present invention provides yet another probing device including a circuit board, a first reinforcing plate, a second reinforcing plate, at least one space transformer, and at least one probe assembly. The first reinforcing plate has a plurality of receiving spaces passed through the first reinforcing plate. The second reinforcing plate is disposed on the circuit board, and the inner conductive wires of the second reinforcing plate are electrically connecting to the conductive wires of the circuit board. The first reinforcing plate is disposed between the second reinforcing plate and the space transformer, and the inner conductive wires of the space transformer is electrically connecting to those of the second reinforcing plate via a plurality of first solder balls. The probe assembly is disposed on the space transformer, and the probe assembly has a plurality of probes. The first solder balls are disposed in the receiving spaces, and the first reinforcing plate abuts against the space transformer.

In the probing device, at least one first gas guide groove is disposed on the first reinforcing plate, the first gas guide groove is connecting to the receiving space, and the first gas guide grooves is horizontally passed through the first reinforcing plate.

In the probing device, the first gas guide groove has a straight-line shape.

In the probing device, the first reinforcing plate has at least one second gas guide groove, the second gas guide groove has a straight-line shape, and the extension direction of the first gas guide groove and that of the second gas guide groove are perpendicular to each other.

In the probing device, the depth of the first gas guide groove is half of the thickness of the first reinforcing plate.

In the probing device, the opening of the first gas guide groove is facing away from the space transformer.

Due to the displacement of the reinforcing plate, the space transformer does not deform while pressed. Therefore, the space transformer can have adequate flatness, which contributes to a longer service life of the space transformer and the probes.

DETAILED DESCRIPTION

Figure 2A:
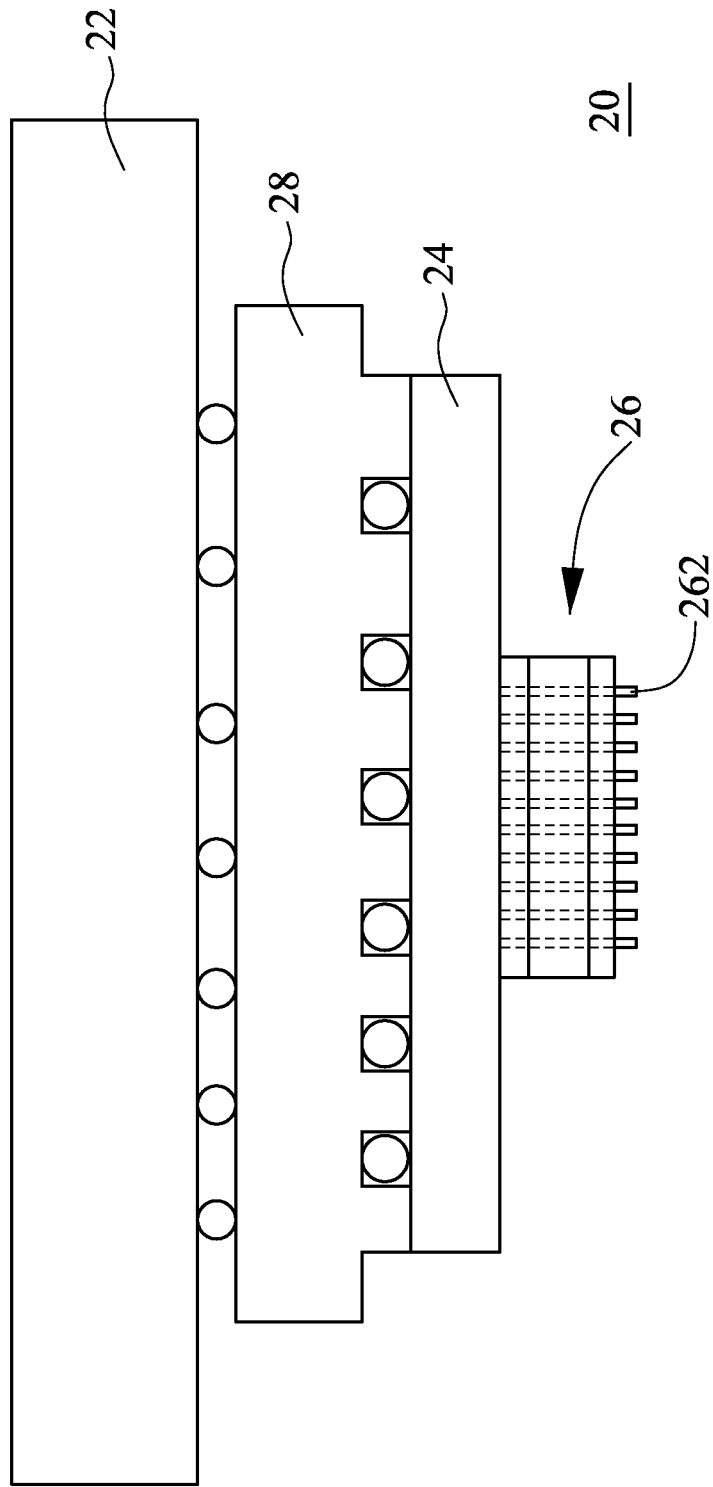
FIG. 2A is a diagram illustrating the first embodiment of a probing device of the present invention.

Please refer to FIG. 2A for a first embodiment of a probing device of the present invention. The probing device 20 includes a circuit board 22, a reinforcing plate 28, a space transformer 24, and a probe assembly 26. The reinforcing plate 28 is disposed on a side of the circuit board 22, and the reinforcing plate 28 has a plurality of inner conductive wires (not shown) electrically connecting to those of the circuit board 22. The reinforcing plate 28 is a multi-layered ceramic (MLC) structure. Due to the higher hardness of ceramic, the probing device 20 as a whole has better mechanical strength. Moreover, the space transformer 24 is disposed on the reinforcing plate 28, and the space transformer 24 has a plurality of inner conductive wires electrically connecting to those of the reinforcing plate 28. The space transformer 24 is a multi-layered organic structure. Furthermore, the probe assembly 26 includes a plurality of probes 262, and the probe assembly 26 is disposed on the space transformer 24.

Figure 2B:
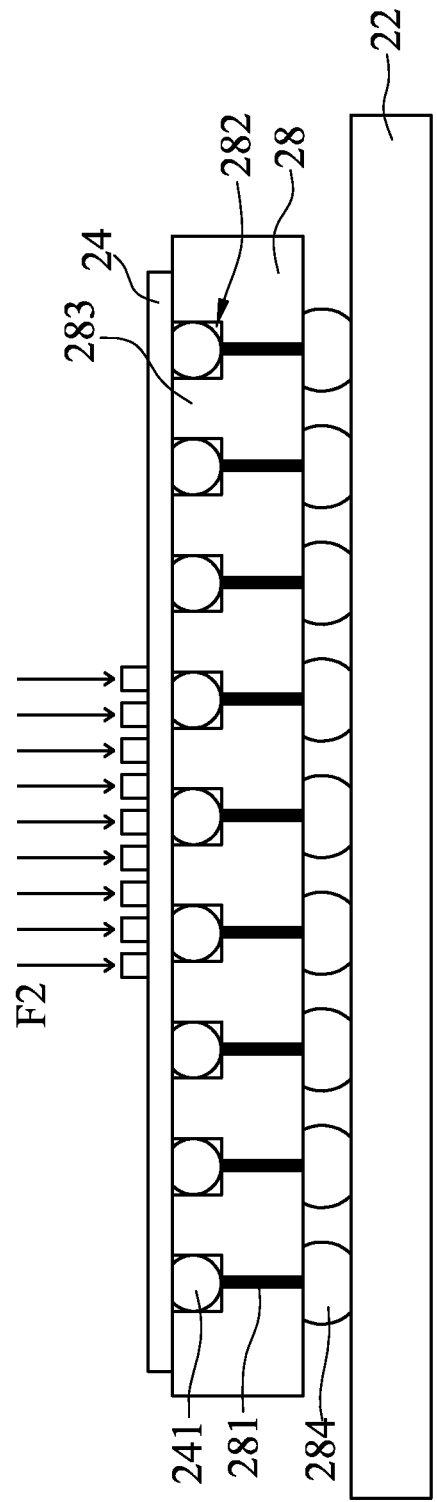
FIG. 2B is a diagram illustrating a detailed structure of the reinforcing plate and the space transformer of FIG. 2A.

Please refer to FIGS. 2A and 2B simultaneously, in which FIG. 2B shows a detailed structure between the reinforcing plate 28 and the space transformer 24. For a better visual presentation of a distribution of force F2, the probes 262 are not shown (and omitted) in FIG. 2B. The space transformer 24 has a plurality of inner conductive wires (not shown), and the reinforcing plate 28 also has a plurality of inner conductive wires 281. The inner conductive wires of the space transformer 24 connects to the inner conductive wires 281 of the reinforcing plate 28 via a plurality of first solder balls 241, in which the inner conductive wires 281 are in contact with the first solder balls 241. In addition, the reinforcing plate 28 has a plurality of protrusions 283 and a plurality of receiving spaces 282 defined by the protrusions 283 for receiving the first solder balls 241, in which the protrusions 283 abut against the space transformer 24 at their upper ends. In the present embodiment, the reinforcing plate 28 is made of machinable ceramic, and therefore the protrusions 283 on the reinforcing plate 28 can be formed by mechanical processing techniques. The first solder balls 241 herein refer to solder pastes, solder balls and the likes.

Figure 1A:
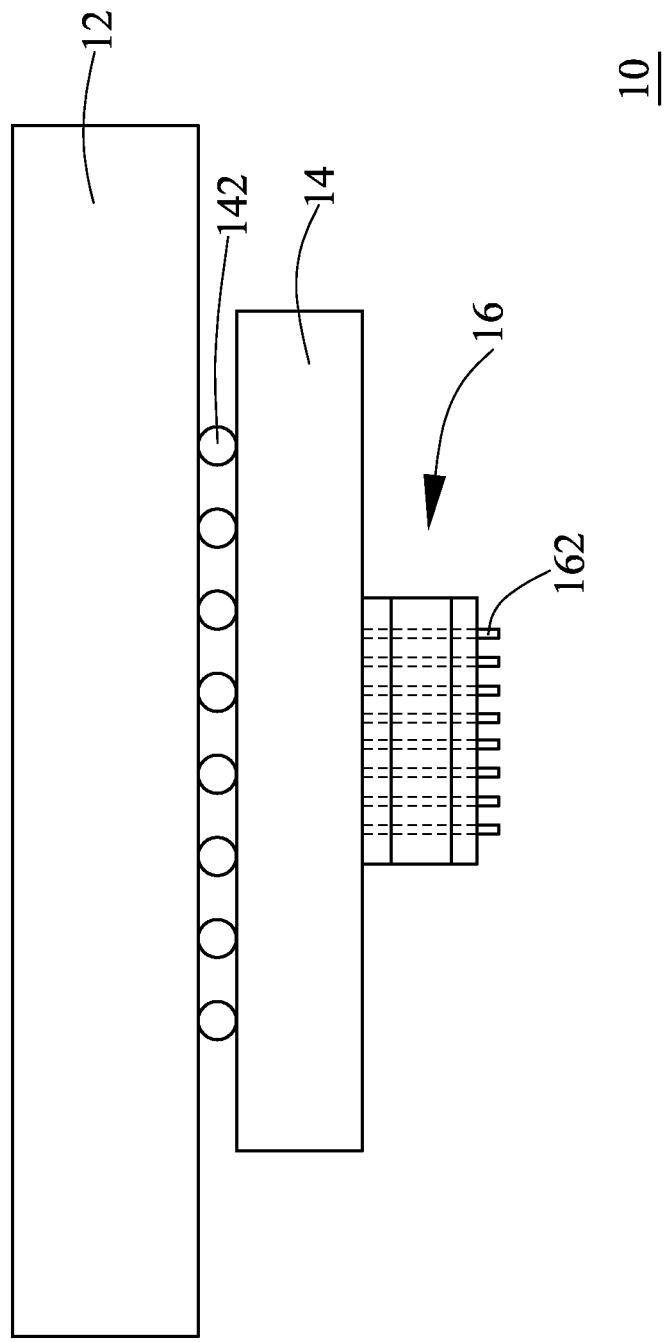
FIG. 1A is a diagram illustrating a conventional probing device.
Figure 1B:
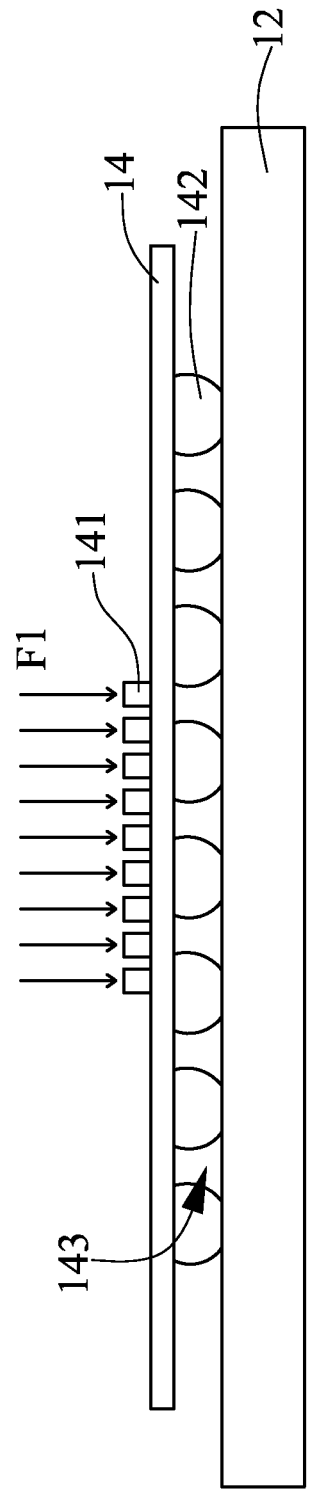
FIG. 1B is a diagram illustrating a force distribution of a space transformer of FIG. 1A.
Figure 1C:
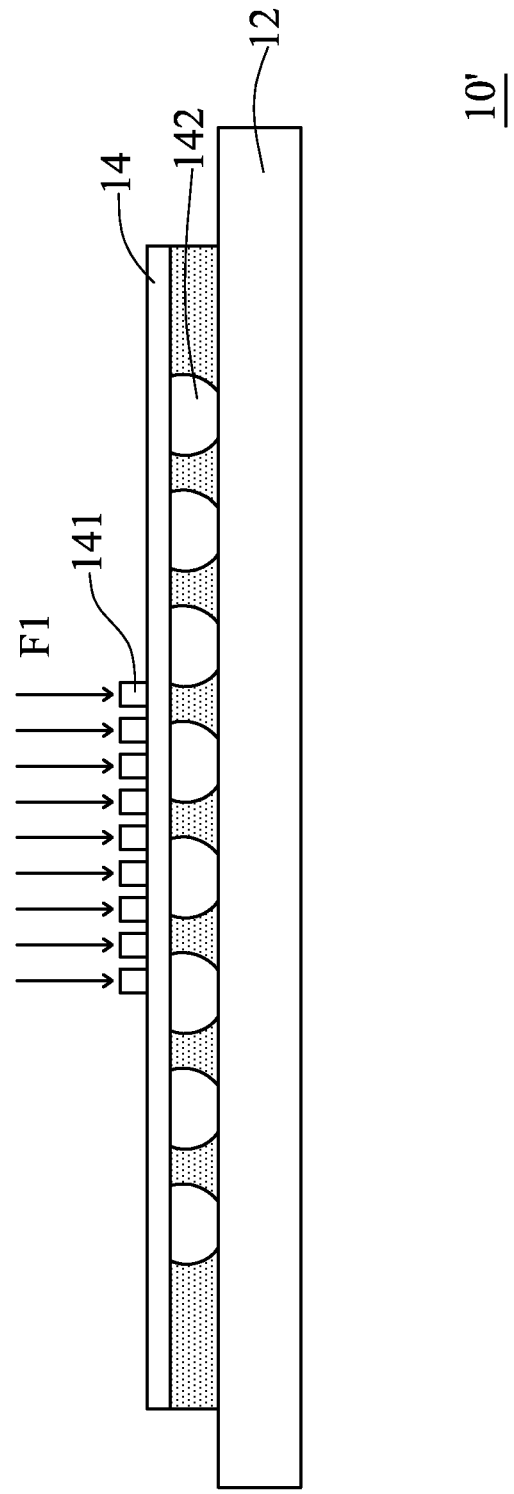
FIG. 1C is a diagram illustrating another conventional probing device.

When the probes 262 of the probe assembly 26 contact a device under test, the device under test applies a counter force to the probes 262 so that the probes 262 further transmit a force F2 to the space transformer 24. The space transformer 24, however, does not plastically deform because it is supported by the first solder balls 241 and the protrusions 283. Therefore, the space transformer 24 of the present embodiment has better or improved flatness compared with the space transformer 14 as in FIGS. 1B and 1C. Even when a smaller amount of over drive is given during probing, the probes 262 can still make practical contact with the pads on the space transformer 24. In such a manner, the space transformer 24 and the probes 262 will have a longer service life, and so will the probing device 20.

On the other hand, there is still a plurality of second solder balls 284 distributed beneath the reinforcing plate 28. Via the second solder balls 284, the conductive wires (not shown) of the circuit board 22 can electrically connect to the conductive wires 281 of the reinforcing plate 28. In addition, the second solder balls 284 also play a role to support the circuit board 22, and thus the second solder balls 284 are preferably located directly beneath the first solder balls 241. There are other substitutes for the second solder balls 284, such as elastic members or anisotropy conductive paste, to electrically connect the conductive wires 281 of the reinforcing plate 28 with those of the circuit board 22.

Figure 3:
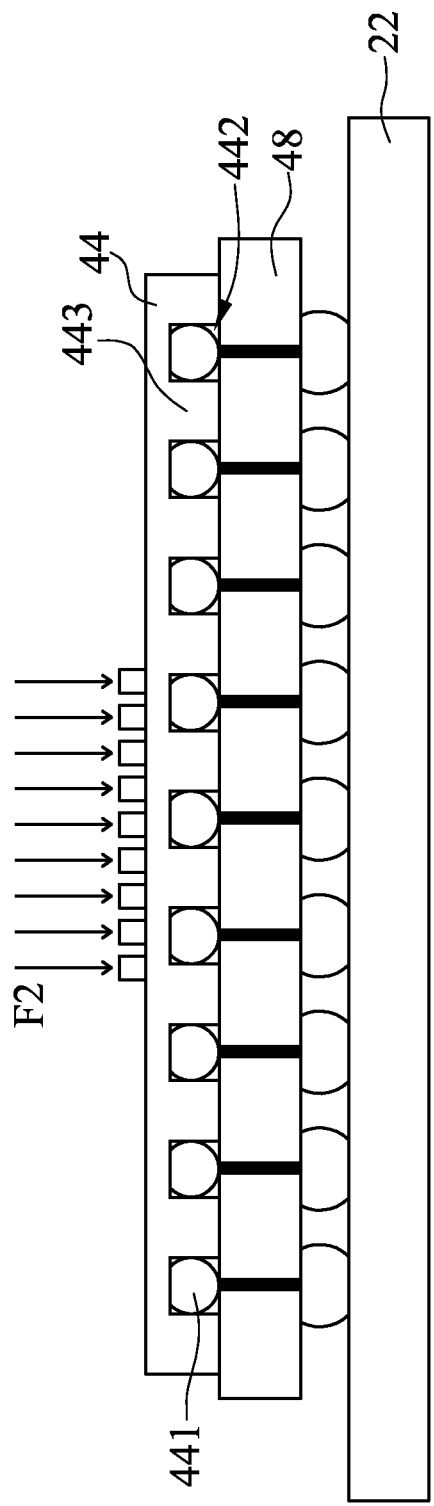
FIG. 3 is a diagram illustrating the second embodiment of a probing device of the present invention.

In the above embodiment, the protrusions 283 are protruded from the reinforcing plate 28 to support the space transformer 24. However, such characteristic is not always necessary. The protrusions 283, for example, can also be formed on the space transformer 24. Referring to FIG. 3, a second embodiment of a probing device of the present invention is shown. In the present embodiment, the reinforcing plate 48 is planar, and the space transformer 44 has a plurality of protrusions 443. These protrusions 443 are adapted to abut against the reinforcing plate 48 and define a plurality of receiving spaces 442 therebetween for receiving the first solder balls 441.

Figure 4:
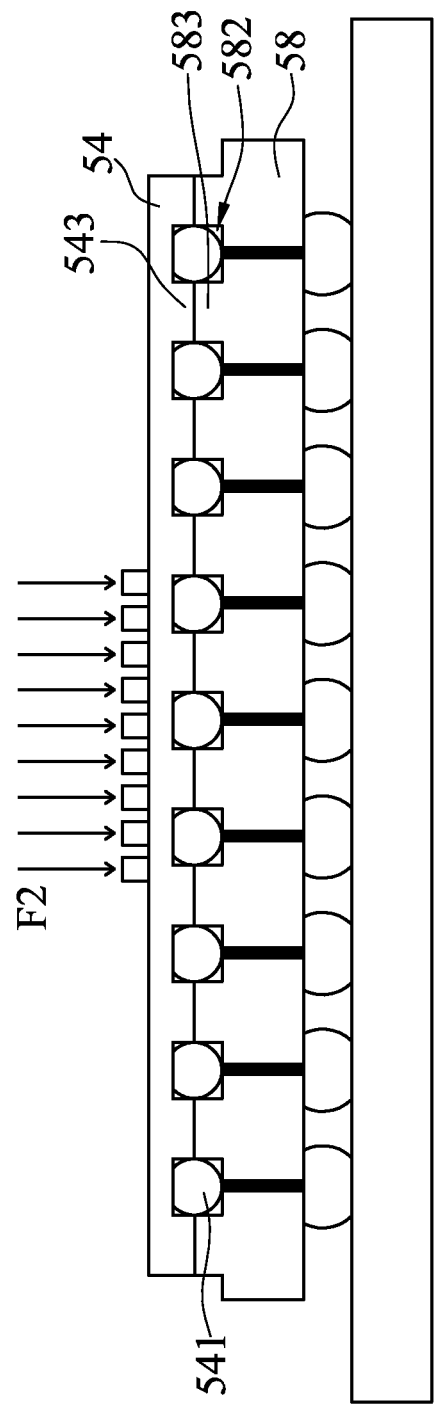
FIG. 4 is a diagram illustrating the third embodiment of a probing device of the present invention.

Furthermore, the protrusions can also be formed both on the reinforcing plate and the space transformer. Please refer to FIG. 4 for a third embodiment of a probing device of the present invention. The reinforcing plate 58 has a plurality of first protrusions 583, and the space transformer 54, on the other hand, has a plurality of second protrusions 543 abutting against the first protrusions 583. A plurality of receiving spaces 582 are defined between the first protrusions 583 and the second protrusions 543 for receiving first solder balls 541.

In the second and third embodiments, the protrusion 443, the first protrusion 583, and the second protrusion 543 are formed, for example, in the manner of lithography. More specifically, a photoresist layer (not shown) is coated on the reinforcing plate 58 or the space transformer 54. The photoresist layer is then patterned to form the protrusions. In other words, the protrusions are made of photoresist. The protrusion 443, the first protrusion 583 and the second protrusion 543 have similar functions as that of the protrusions 283 in FIG. 2B, which can avoid the space transformer from deformation.

Figure 5:
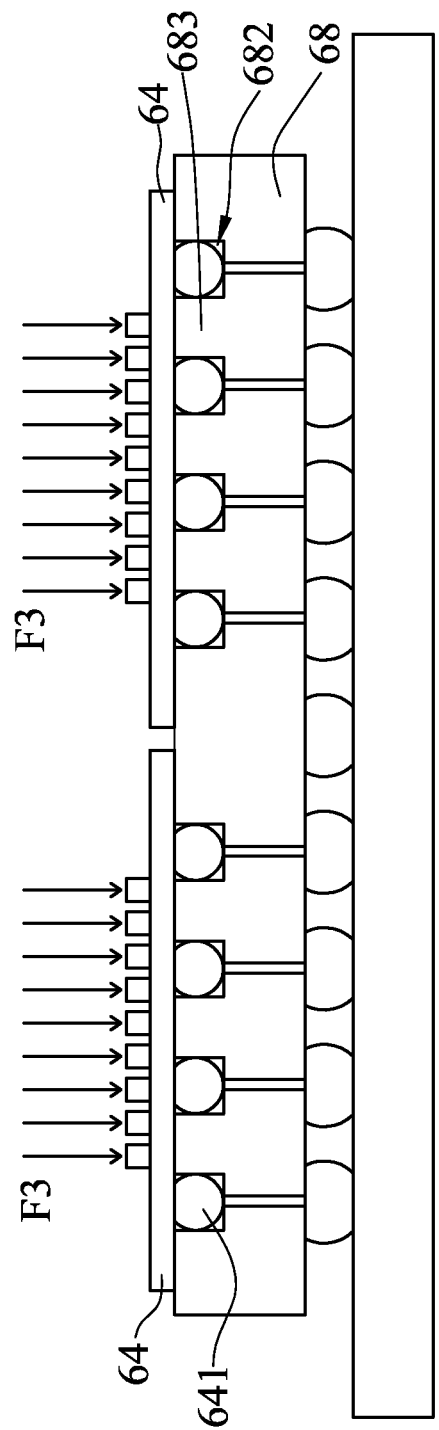
FIG. 5 is a diagram illustrating a detailed structure of the reinforcing plate and the space transformers, which is structurally similar to those of the third embodiment of the present invention.

In the above embodiments, there is only one space transformer disposed on the reinforcing plate 28. However, two or more space transformers can also be disposed on the reinforcing plate. Please refer to FIG. 5 for a detailed structure of the reinforcing plate and the space transformers, which is structurally similar to those of the third embodiment of the present invention. In the present embodiment, two space transformers 64 are disposed on the reinforcing plate 68. Moreover, the protrusions 683 of the reinforcing plate 68 are adapted to abut against the space transformers 64, which as a result, do not deform even when pressed by a force F3 due to the support of the reinforcing plate 68.

Figure 6A:
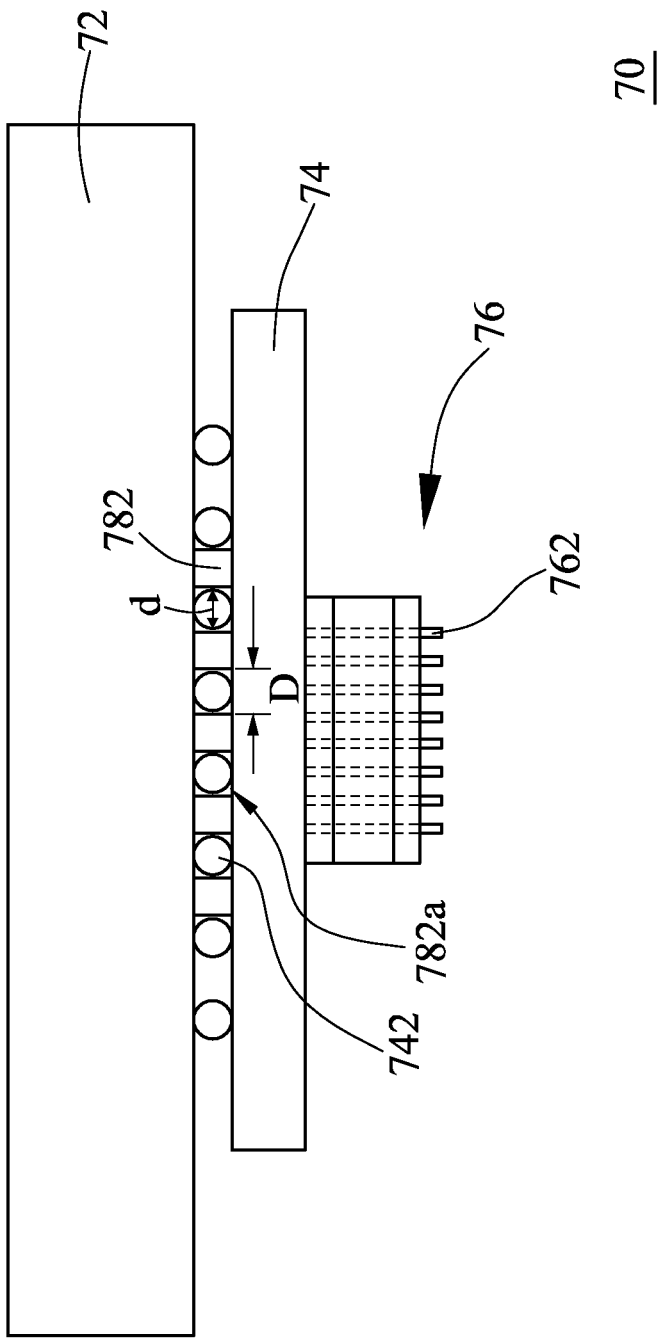
FIG. 6A is a diagram illustrating the fourth embodiment of a probing device of the present invention.

Please refer to FIG. 6A, in which FIG. 6A shows the fourth embodiment of a probing device of the present invention. In the fourth embodiment, the probing device 70 includes a circuit board 72, a first reinforcing plate 782, at least one space transformer 74, and at least one probe assembly 76. The space transformer 74 is disposed on the circuit board 72 via a plurality of first solder balls 742, and the probe assembly 76 is mounted on the space transformer 74. The probe assembly 76 includes a plurality of probes 762, and a chip on the wafer can be tested by the probes 762. A plurality of inner conductive wires (not shown) is disposed in the space transformer 74.

By means of the inner conductive wires, the probes 762 of the probe assembly 76 are electrically connected to the conductive wires in the circuit board 72. In summary, by using reflowing method or the first solder balls 742, the circuit board 72 and the space transformer 74 are mounted together and electrically connect the inner conductive wire of each other.

The first reinforcing plate 782 is made of machinable ceramic, so that the first reinforcing plate 782 has higher hardness, and thus enhancing the strength of the probing device 70. The first reinforcing plate 782 has a plurality of receiving spaces 782a and the receiving spaces 782a are formed by using machining tool to penetrate through the first reinforcing plate 782. The space transformer 74 is a multi-layered organic structure and mounted on the first reinforcing plate 782, and the first reinforcing plate 782 abuts against the space transformer 74. From the presentation of FIG. 6A, the person having ordinary skill in the art can identify that the width of the first reinforcing plate 782 is smaller than that of the space transformer 74, and the width of the first reinforcing plate 782 is larger than or equal to (the "larger than" version is illustrated in the present illustrated embodiment) the width of the probe assembly 76.

Figure 6B:
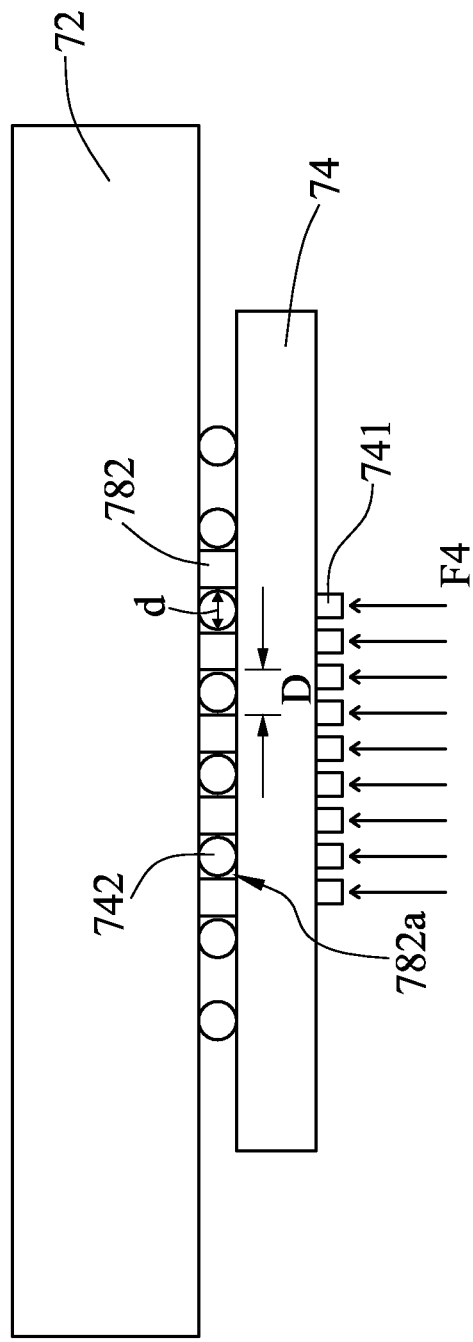
FIG. 6B is a diagram illustrating a force distribution of a probing device in the fourth embodiment.
Figure 6D:
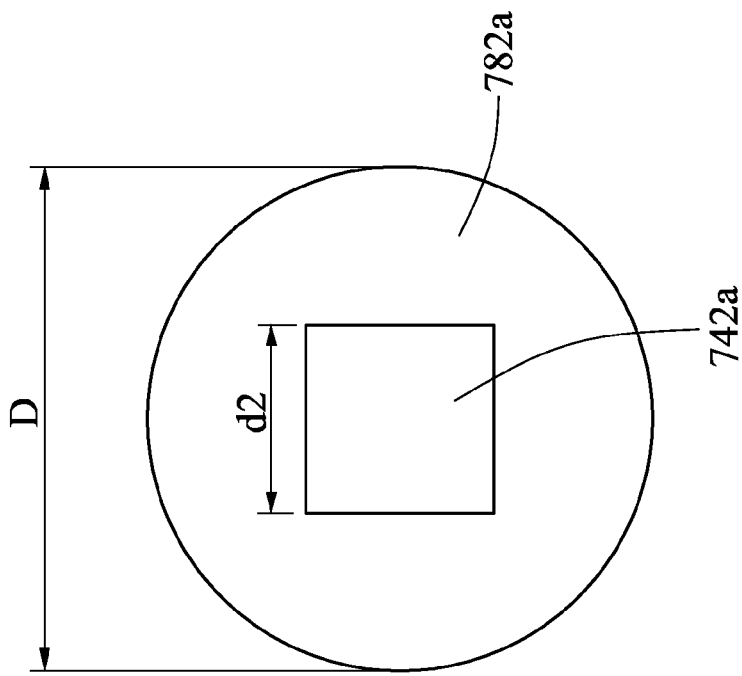
FIG. 6D is a schematic diagram of the solder balls using in the probing device of another embodiment.
Figure 6C:
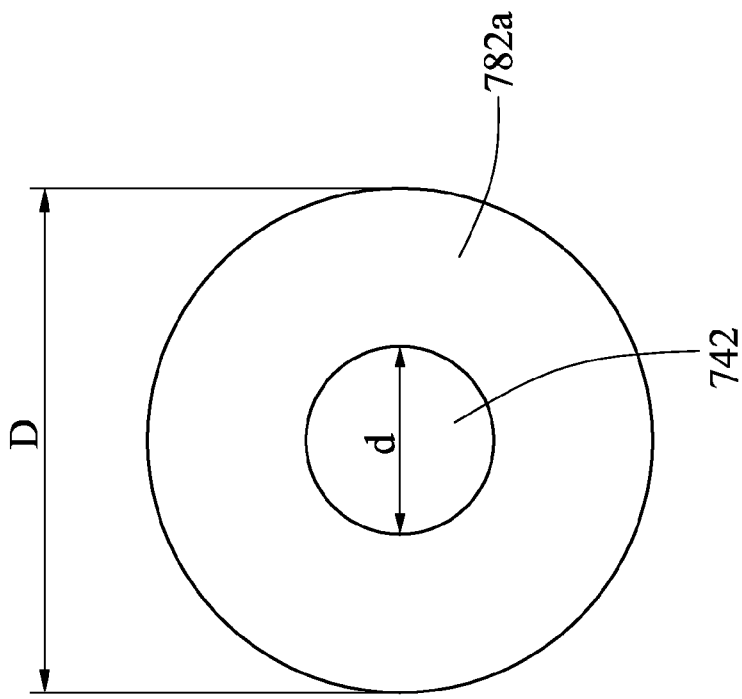
FIG. 6C is a schematic diagram of the solder balls using in the probing device of the embodiment.

Please refer to FIG. 6A and FIG. 6B simultaneously, in which FIG. 6B shows a force distribution of a probing device in the fourth embodiment. For a better presentation of a distribution of force F4, the probes 762 are not shown (and omitted) in FIG. 6B. When the probes 762 of the probe assembly 76 contact a device under test, the device under test applies a counter force F4 to the probes 762 so that the probes 762 further transmit a force F4 to the pads 741 on the space transformer 74. Because the width of the first reinforcing plate 782 is larger than or equal to the width of the probe assembly 76, the space transformer 74 is supported by the first reinforcing plate 782 and the first solder balls 742, and thus preventing the space transformer 74 from being deformed due to force F4. Therefore, the space transformer 74 can have adequate flatness, and so when even a smaller amount over drive is given during probing, the probes 762 can still make practical contact with the pads 741 on the space transformer 74. In such a manner, the space transformer 74 and the probes 762 will have a longer service life, and so will the probing device 70. The inner conductive wire (not shown) of the space transformer 74 is electrically connected to the conductive wire of the circuit board 72 via the first solder balls 742, and the first solder balls 742 are disposed in the receiving space 782a. Please refer to FIG. 6C, in which FIG. 6C shows a schematic diagram of the solder balls being used in the probing device of the embodiment. The diameter D of the receiving space 782a is larger than the diameter d of the first solder balls 742, but the diameter d of the first solder balls 742 can be set to be equal to the diameter D of the receiving space 782a. The shape of the first solder balls 742 is not necessary limited to the spherical shape, and it can be a cubic or other shape. Please refer to FIG. 6D, the first solder ball 742a is made as a cubic shape, the diameter D of the receiving space 782a is larger than or equal to (the "larger than" version is shown in the illustrated embodiment) the largest width d2 of the first solder ball 742a. The probe assembly 76 is mounted on the space transformer 74 and the probe assembly 76 includes a plurality of probes 762.

Figure 7:
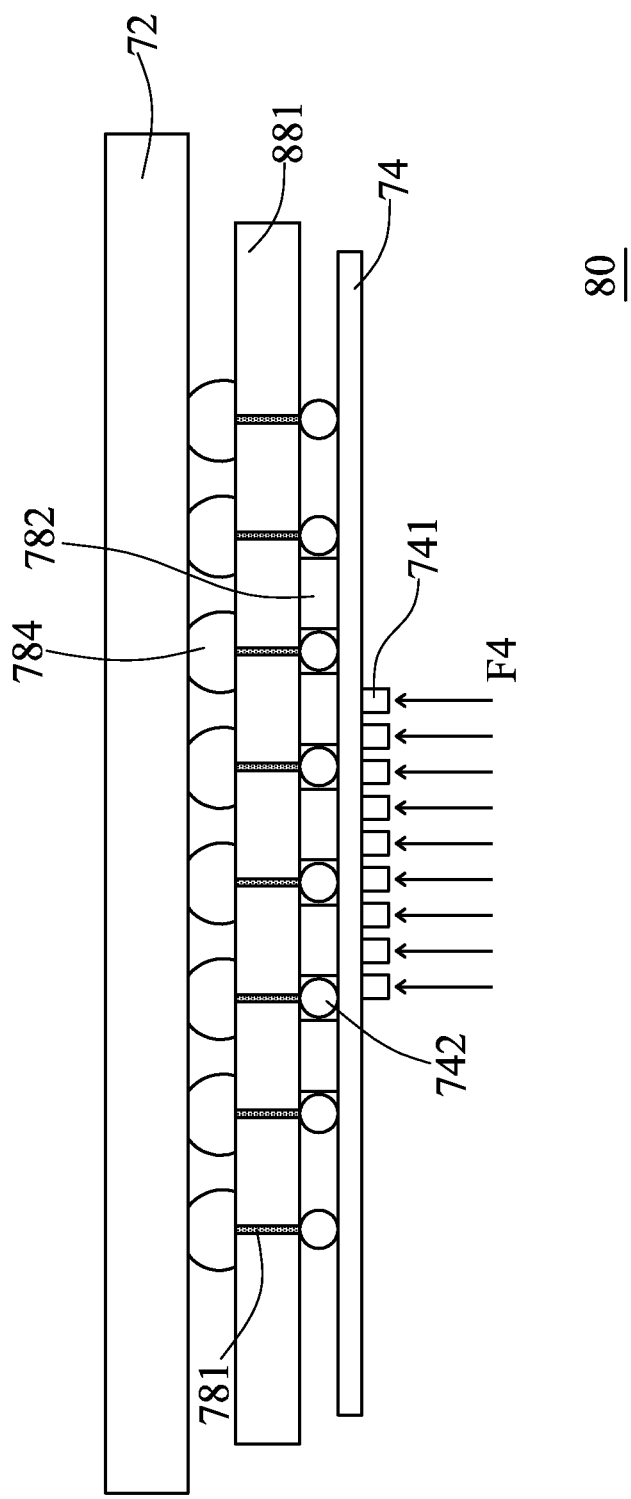
FIG. 7 is a diagram illustrating the fifth embodiment of a probing device of the present invention.

Please refer to FIG. 7, in which FIG. 7 shows a fifth embodiment of a probing device 80. In order to further enhance the strength of the probe device, compared to the probe device 70 of the fourth embodiment, a second reinforcing plate 881 is added in the probe device 80 of the fifth embodiment. For a better presentation of a distribution of force F4, the probes 762 shown as FIG. 6A are omitted in FIG. 7. The second reinforcing plate 881 is mounted on the circuit board 72 and disposed between the circuit board 72 and the first reinforcing plate 782. The inner conductive wire 781 of the second reinforcing plate 881 is electrically connected to the conductive wire (not shown) of the circuit board 72. Furthermore, a plurality of second solder balls 784 is disposed on the second reinforcing plate 881. Via the second solder balls 784 disposed by reflow method, a plurality of conductive wires (not shown) in the circuit board 72 is electrically connecting to the plurality of conductive wires 781 of the second reinforcing plate 881. In addition, the second solder ball 784 play a role to support the circuit board 72 and is preferably disposed directly above the first solder balls 742. In other embodiments, the second solder balls 784 can be replaced by flexible elastomer, anisotropic conductive paste, or any other structure, which is for electrically connecting the conductive wire of the circuit board 72 and the inner conductive wire 781 in the second reinforcing plate 881.

Figure 8A:
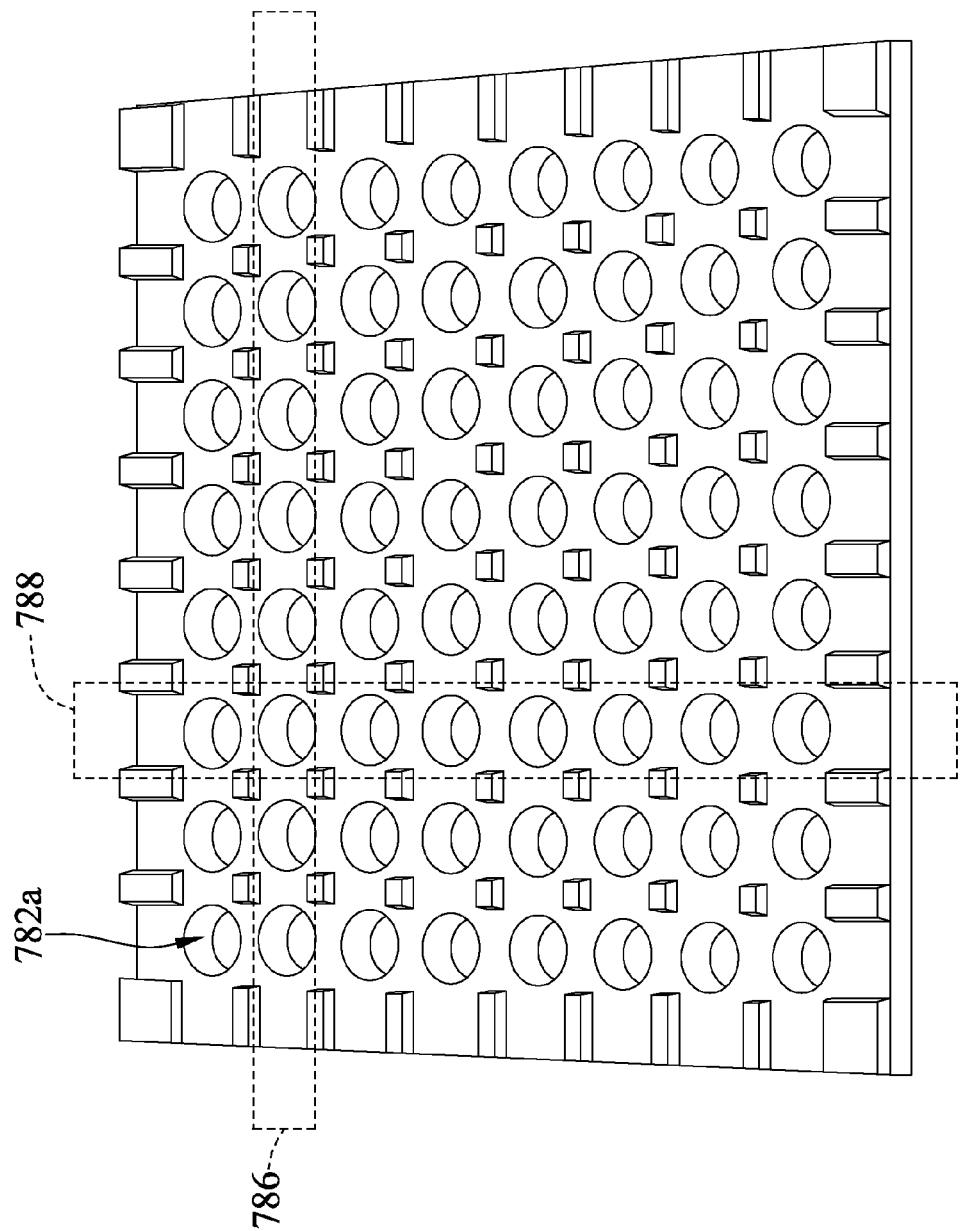
FIG. 8A is a 3D diagram of the first reinforcing plate.

Please refer to FIG. 8A, in which FIG. 8A shows a 3D diagram of the first reinforcing plate. A plurality of first gas guide grooves 786 and a plurality of second gas guide grooves 788 are shown in the dotted lines in FIG. 8A. In order to easily discharge exhaust gas produced during the reflow of the first solder balls 742, the first gas guide grooves 786 and the second gas guide grooves 788 are disposed on the first reinforcing plate 782 in the embodiment. The first gas guide grooves 786 and the second gas guide grooves 788 are connected to the receiving spaces 782a, and the first gas guide grooves 786 and the second gas guide grooves 788 are penetrated through the first reinforcing plate 782 horizontally. Furthermore, the width of the first gas guide grooves 786 and the width of the second gas guide grooves 788 are approximately equal to the diameter of the receiving space 782a.

Via the first gas guide grooves 786 and the second gas guide grooves 788, the first gas guide grooves 786 and the second gas guide grooves 788 are connected to the external environment. The first gas guide grooves 786 and the second gas guide grooves 788 are manufactured by the milling cutter, and the first gas guide grooves 786 and the second gas guide grooves 788 are perpendicular to each other. Therefore, the exhaust gas produced during the reflow of the first solder balls 742 is discharged into the external environment via the first gas guide grooves 786 and the second gas guide grooves 788. It is noticeable that the extension directions of the first gas guide grooves 786 and the second gas guide grooves 788 are determined based on the arrangement of the first solder balls 742, and the first solder balls 742 is not limited to be arranged in a straight line and can be arranged in a random line, so the extension directions of the first gas guide grooves 786 and the second gas guide grooves 788 may be a random line, and the first gas guide grooves 786 are intercrossed to the second gas guide grooves 788. It is noticeable that the first gas guide grooves 786 and the second gas guide grooves 788 are not both required to be disposed at the same time, that is to say, the person having ordinary skill in the art can dispose only either the first gas guide grooves 786 or the second gas guide grooves 788.

Figure 8B:
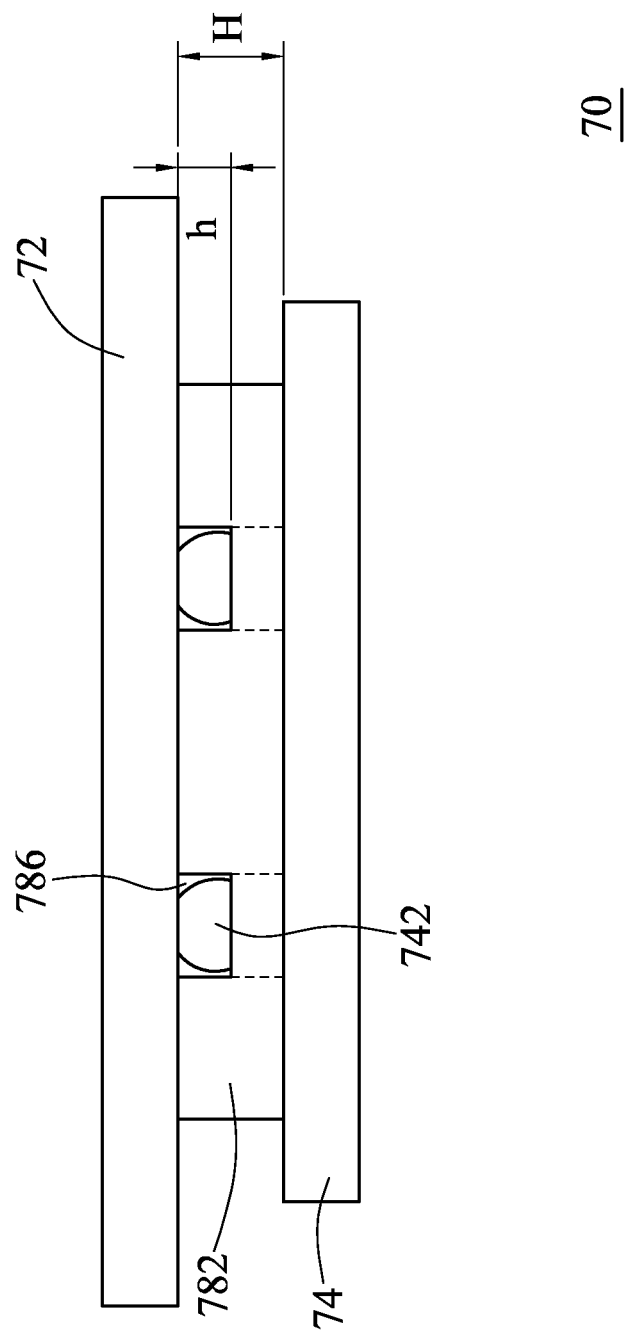
FIG. 8B is a diagram illustrating the positional relationship between the first gas guide grooves and the circuit board.
Figure 8C:
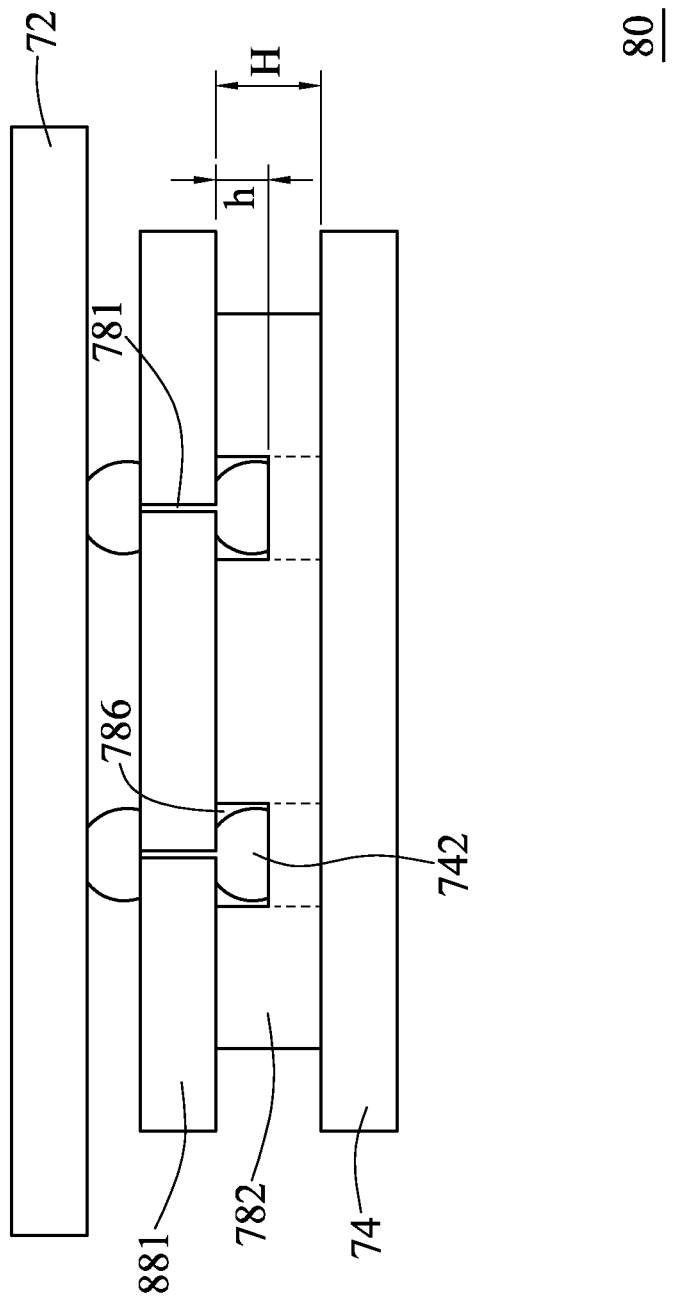
FIG. 8C is a diagram illustrating the positional relationship between the first gas guide grooves and the second reinforcing plate.

Please refer to FIG. 8B and FIG. 8C, in which FIG. 8B shows the positional relationship between the first gas guide grooves 786 and the circuit board, and FIG. 8C shows the positional relationship between the first gas guide grooves 786 and the second reinforcing plate 881. FIG. 8B and FIG. 8C show the relative positions of the first gas guide grooves 786 in the probing device 70 and the probing device 80. In the probing device 70 of fourth embodiment, the first gas guide groove 786 is facing away from the space transformer 74, i.e. the opening of the first gas guide groove 786 is facing towards the circuit board 72. In addition, the second gas guide groove 788 is not shown in FIG. 8B and the opening thereof is also facing towards the circuit board 72.

In the probing device 80, the first gas guide groove 786 is facing away from the space transformer 74, i.e. the opening of the first gas guide groove 786 is facing towards the second reinforcing plate 881. In addition, the second gas guide groove 788 is not shown in FIG. 8C and the opening thereof is also facing towards the second reinforcing plate 881.

Please refer to FIG. 8A~FIG. 8C simultaneously. The depth h of the first gas guide groove 786 and the second gas guide groove 788 is approximately equal to or smaller than a half of the thickness H of the first reinforcing plate 782. The depth h of the first gas guide groove 786 and the second gas guide groove 788 is not limited to be half of the thickness H of the first reinforcing plate 782, and the depth h can be adjusted depending on the situation.

Those skilled in the art will readily observe that numerous modifications and alterations of the device and method may be made while retaining the teachings of the invention. Accordingly, the above disclosure should be construed as limited only by the meters and bounds of the appended claims.

The invention claimed is:

1. A probing device, comprising:
   a circuit board;
   a reinforcing plate, disposed on the circuit board, the reinforcing plate having a plurality of inner conductive wires electrically connecting to a plurality of conductive wires of the circuit board;
   at least one space transformer, disposed on the reinforcing plate, the space transformer having a plurality of inner conductive wires electrically connecting to the inner conductive wires of the reinforcing plate via a plurality of solder balls; and
   at least one probe assembly, disposed on the space transformer, the probe assembly comprising a plurality of probes;
   wherein a plurality of receiving spaces are defined by and located between the reinforcing plate and the space transformer for receiving the first solder balls therein, and the reinforcing plate abuts against the space transformer.

2. The probing device of claim 1, wherein the reinforcing plate has a plurality of protrusions abutting against the space transformer, and the receiving spaces are defined by the protrusions.

3. The probing device of claim 2, wherein the reinforcing plate is made of machinable ceramic.

4. The probing device of claim 2, wherein the protrusion is made of photoresist.

5. The probing device of claim 1, wherein the reinforcing plate has a plurality of first protrusions, the space transformer has a plurality of second protrusions abutting against the first protrusions, and the receiving spaces are defined by the first protrusions and the second protrusions.

6. The probing device of claim 5, wherein the first and second protrusions are made of photoresist.

7. The probing device of claim 1, wherein the space transformer has a plurality of protrusions abutting against the reinforcing plate, and the receiving spaces are defined by the protrusions.

8. The probing device of claim 1, wherein the reinforcing plate has a plurality of inner conductive wires electrically connecting to the conductive wires of the circuit board via a plurality of second solder balls located directly beneath the first solder balls.

9. The probing device of claim 1, wherein the reinforcing plate is a multi-layered ceramic structure, the space transformer is a multi-layered organic structure.

10. A probing device, comprising:
a circuit board;
a first reinforcing plate, disposed on the circuit board, the first reinforcing plate having a plurality of receiving spaces, the receiving spaces passed through the first reinforcing plate;
at least one space transformer, disposed on the first reinforcing plate, the space transformer having a plurality of inner conductive wires electrically connecting to a plurality of conductive wires of the circuit board via a plurality of solder balls; and
at least one probe assembly, disposed on the space transformer, the probe assembly comprising a plurality of probes;
wherein the first solder balls are disposed in the receiving spaces, and the first reinforcing plate abuts against the space transformer.

11. The probing device of claim 10, wherein at least one first gas guide groove is disposed on the first reinforcing plate, the first gas guide groove is connecting to the receiving space, and the first gas guide groove is horizontally passed through the first reinforcing plate.

12. The probing device of claim 11, wherein the first gas guide groove has a straight-line shape.

13. The probing device of claim 12, wherein the first reinforcing plate has at least one second gas guide groove, the second gas guide groove has a straight-line shape, and the extension direction of the first gas guide groove and the extension direction of the second gas guide groove are perpendicular to each other.

14. The probing device of claim 11, wherein the first gas guide groove has a random line shape.

15. The probing device of claim 14, wherein the first reinforcing plate has at least one second gas guide groove, the second gas guide groove has a random line shape, and the first gas guide groove and the second gas guide groove are intercrossed to each other.

16. The probing device of claim 11, wherein the depth of the first gas guide groove is equal to or smaller than a half of the thickness of the first reinforcing plate.

17. The probing device of claim 11, wherein the opening of the first gas guide groove is facing away from the space transformer.

18. A probing device, comprising:
a circuit board;
a first reinforcing plate, the first reinforcing plate having a plurality of receiving spaces, the receiving spaces passed through the first reinforcing plate;
a second reinforcing plate, disposed on the circuit board, the inner conductive wires of the second reinforcing plate are electrically connecting to the conductive wires of the circuit board;
at least one space transformer, the first reinforcing plate disposed between the second reinforcing plate and the space transformer, the inner conductive wires of the space transformer are electrically connecting to the inner conductive wires of the second reinforcing plate via a plurality of first solder balls; and
at least one probe assembly, disposed on the space transformer, the probe assembly comprising a plurality of probes;
wherein the first solder balls are disposed in the receiving spaces, and the first reinforcing plate abuts against the space transformer.

19. The probing device of claim 18, wherein at least one first gas guide groove is disposed on the first reinforcing plate, the first gas guide groove is connecting to the receiving space, and the first gas guide grooves is horizontally passed through the first reinforcing plate.

20. The probing device of claim 19, wherein the first gas guide groove has a straight-line shape.

21. The probing device of claim 20, wherein the first reinforcing plate has at least one second gas guide groove, the second gas guide groove has a straight-line shape, and the extension direction of the first gas guide groove and the extension direction of the second gas guide groove are perpendicular to each other.

22. The probing device of claim 19, wherein the first gas guide groove has a random line shape.

23. The probing device of claim 22, wherein the first reinforcing plate has at least one second gas guide groove, the second gas guide groove has a random line shape, and the first gas guide groove and the second gas guide groove are intercrossed to each other.

24. The probing device of claim 19, wherein the depth of the first gas guide groove is equal to or smaller than a half of the thickness of the first reinforcing plate.

25. The probing device of claim 19, wherein the opening of the first gas guide groove is facing away from the space transformer.

* * * * *